US006461493B1

(12) United States Patent
Farooq et al.

(10) Patent No.: US 6,461,493 B1
(45) Date of Patent: Oct. 8, 2002

(54) DECOUPLING CAPACITOR METHOD AND STRUCTURE USING METAL BASED CARRIER

(75) Inventors: Mukta S. Farooq; Shaji Farooq; John U. Knickerbocker, all of Hopewell Junction; Robert A. Rita, Wappingers Falls; Srinivasa N. Reddy, LaGrangeville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/472,136

(22) Filed: Dec. 23, 1999

(51) Int. Cl.[7] .............................. C25D 5/02; H01G 4/06
(52) U.S. Cl. .................... 205/118; 205/122; 361/311
(58) Field of Search .............................. 205/118, 122; 438/3, 250; 361/311

(56) References Cited

U.S. PATENT DOCUMENTS

| 5,272,600 A | 12/1993 | Carey ........................ 361/792 |
| 5,590,016 A | 12/1996 | Fujishiro et al. ............ 361/313 |
| 5,635,419 A * | 6/1997 | Geiss et al. ................. 438/386 |
| 5,668,399 A | 9/1997 | Cronin et al. ............... 257/532 |
| 5,745,333 A | 4/1998 | Frankeny et al. ........... 361/313 |
| 5,770,476 A | 6/1998 | Stone .......................... 361/313 |
| 5,811,868 A | 9/1998 | Bertin et al. ................ 257/516 |
| 5,854,534 A | 12/1998 | Beilin et al. ................ 257/691 |

OTHER PUBLICATIONS

Cava, R.F., W. F. Peck Jr, and J. J. Krajewski, Enhancement of the Dielectric Constant of $Ta_2O_5$ Through Substitution with $TiO_2$, Nature, vol. 377, pp. 215–217, Sep. 21, 1995.

* cited by examiner

*Primary Examiner*—Nam Nguyen
*Assistant Examiner*—Erica Smith-Hicks
(74) *Attorney, Agent, or Firm*—Ira D. Blecker (57) ABSTRACT

A process for fabricating a structure using a metal carrier and forming a double capacitor structure. The process comprises forming a first via hole through the metal carrier, forming a dielectric layer around the metal carrier and inside the first via hole, forming a second via hole through the dielectric layer and the metal carrier, and filling at least one of the via holes with conductive material. In one preferred embodiment, the process further comprises forming a third via hole through the metal carrier before the forming of a dielectric layer, wherein the dielectric layer is formed around the metal carrier, inside the first via hole, and inside the third via hole. The first via hole, the second via hole, and the third via hole are all filled with a conductive material. In one preferred embodiment, the dielectric layer comprises a top surface opposed to a bottom surface, and electrodes are formed on at least one of the top surface and the bottom surface of the dielectric layer.

20 Claims, 4 Drawing Sheets

DECOUPLING CAPACITOR METHOD AND STRUCTURE USING METAL BASED CARRIER

BACKGROUND OF THE INVENTION

The present invention relates generally to decoupling capacitors. More particularly, the present invention relates to the manufacturing of a structure comprising a decoupling capacitor having a metal based carrier.

As substrate packages for integrated circuits on semiconductor chips become denser and faster, there has been a significant increase in the requirements that the newer substrate packages need to meet. For example the substrate packages designed for microwave applications involve high power density chips and interconnections requiring high currents. This imposes severe restrictions in terms of thermal management and also current carrying capability, on these substrate packages. The substrate packages aimed at applications especially in communications need to be thin and highly brazable. Also, certain electrical design requirements dictate that the backside of the substrate packages be metallized for providing a ground cage and slot line type transmission lines be made by embedding large area metal features in the dielectric layer. The substrate packages for digital applications require denser and denser wiring, requiring finer features (lines and vias) to be incorporated at lower costs. There is also a strong drive to reduce the defect density in both the chip carriers and in the passive components in the substrate packages.

The conventional method to build such substrate packages (SCM's and MCM's) utilizes multi-layer-ceramic (MLC) processing. This involves making green sheets from the dielectric powder of choice, screening those green sheets with paste(s) of selected metallization to produce patterns and through sheet connections, or vias, stacking these screened green sheets, laminating the green sheets, and then sintering the green sheets to form a three-dimensionally connected substrate package. Sintering large size substrate packages with the very high metal loading, typically required for the communications packages, creates considerable difficulties in controlling the shrinkage, distortion, and flatness of substrate packages at the end of the process. Special processing steps have to be added to assure the flatness of the substrate packages. Also, the backside metallization required to build conventional substrate packages is done by a combination of physical deposition methods and electroplating. The high tolerance required for fabricating substrate packages with very fine features cannot be increased beyond a certain limit due to the distortion of green sheets during various processing steps. Overall processing costs of the substrate packages produced using MLC techniques are relatively higher because of the longer cycle times. Therefore there is a need to develop cost effective ways to produce such substrate packages.

In some substrate packages, decoupling capacitors are required as part of the substrate package to enhance the performance of the chip. New decoupling capacitor designs which enable low inductance paths to the chip yet deliver high capacitance without consuming expensive real estate on the substrate, are the preferred solution, particularly as chip frequencies increase. Thus, what is needed is a decoupling capacitor that has a high dielectric constant combined with a low thickness of the film. Preferably, the decoupling capacitor is simple to manufacture, is flexible to accommodate a wide variety of chip designs, and does not use up valuable real estate on the substrate package, compared with prior art techniques.

BRIEF SUMMARY OF THE INVENTION

An aspect of the present invention is a process for fabricating a structure using a metal carrier and forming a double capacitor structure. The process comprises forming a first via hole through the metal carrier, forming a dielectric layer around the metal carrier and inside the first via hole, forming a second via hole through the dielectric layer and the metal carrier, and filling at least one of the via holes with conductive material. In one preferred embodiment, the process further comprises forming a third via hole through the metal carrier before the forming of a dielectric layer, wherein the dielectric layer is formed around the metal carrier, inside the first via hole, and inside the third via hole. The first via hole, the second via hole, and the third via hole are all filled with a conductive material. In one preferred embodiment, the dielectric layer comprises a top surface opposed to a bottom surface, and electrodes are formed on at least one of the top surface and the bottom surface of the dielectric layer.

Another aspect of the present invention is a process for fabricating a substrate package using a metal carrier and forming a single capacitor structure. The process comprises forming a first via hole through the metal carrier, forming an dielectric layer around the metal carrier and the first via hole, wherein the dielectric layer comprises a top dielectric layer opposed to a bottom dielectric layer, removing the top dielectric layer, and filling the first via hole with conductive material. In one preferred embodiment, the process further comprises forming a second via hole and a third via hole through the metal carrier. The second via hole and the third via hole are filled with conductive material. In one preferred embodiment, the dielectric layer comprises bottom surfaces, and the electrodes are formed on at least one of the metal carrier and the bottom surfaces.

These and other aspects of the invention will become apparent upon a review of the following detailed description of the presently preferred embodiments of the invention, when viewed in conjunction with the appended drawings.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF THE PRESENTLY PREFERRED EMBODIMENT OF THE INVENTION

Figure 1:
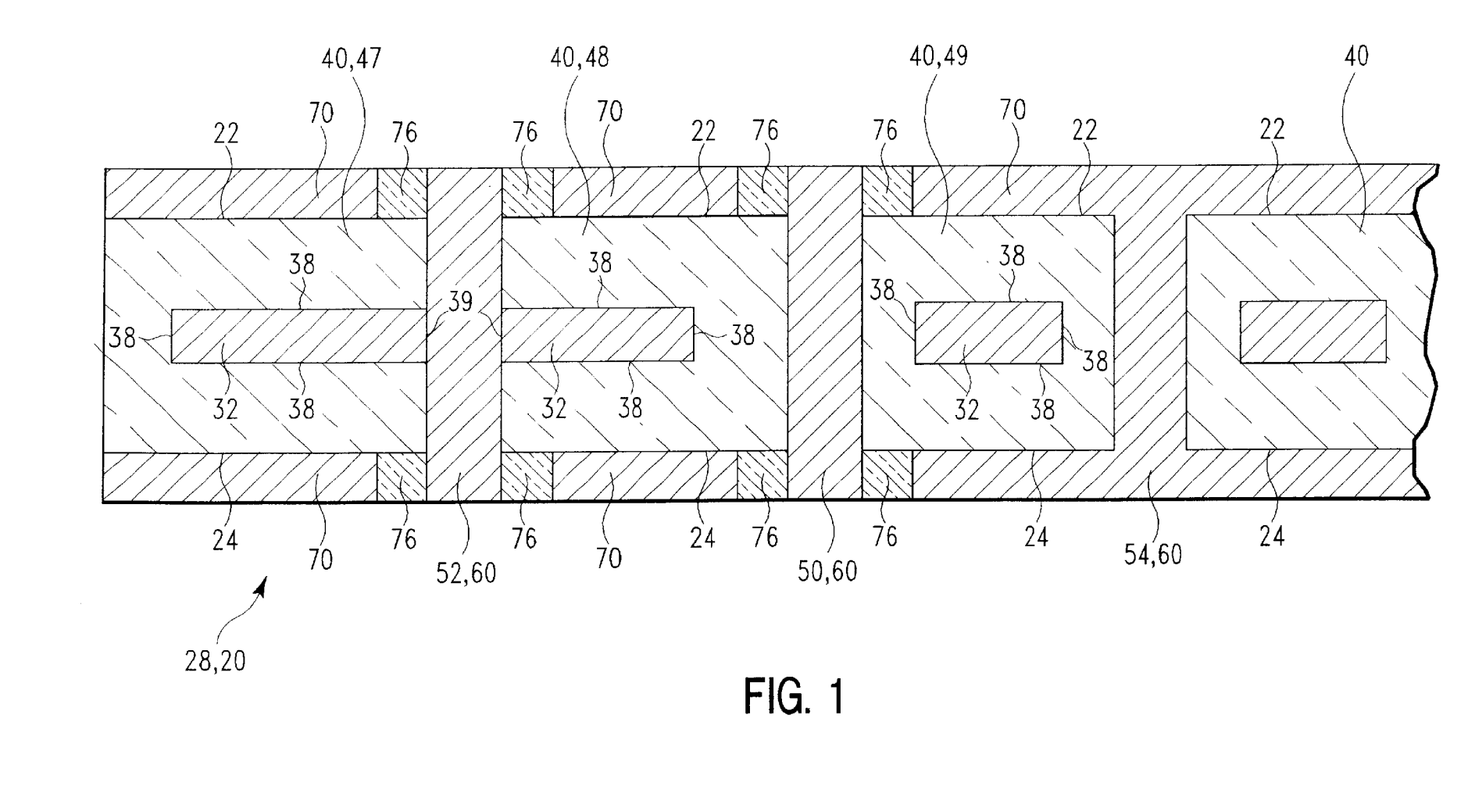
FIG. 1 illustrates, in cross-section, a portion of a structure forming a double capacitor structure, in accordance with the invention.

Shown in FIG. 1, in cross-section, is structure 20 forming double capacitor structure 28. Please note that while FIG. 1 illustrates only one complete double capacitor structure 28, a structure 20 may have thousands or even millions of double capacitor structures identical to double capacitor structure 28. For the sake of clarity, these additional double capacitor structures have been left out of FIG. 1.

FIG. 1 illustrates the physical structure for double capacitor structure 28, which can be formed by processes and methods described hereafter. Double capacitor structure 28 comprises first metal segment 32, second metal segment 34, and third metal segment 36. In one preferred embodiment, first metal segment 32, second metal segment 34, and third metal segment 36 comprise a material selected from the group consisting of titanium, tantalum, nickel, aluminum and alloys thereof; however, they may comprise any conductive material that forms an insulating oxide layer as described hereafter. In one preferred embodiment, first metal segment 32, second metal segment 34, and third metal segment 36 comprise an alloy of titanium and tantalum wherein the percentage of titanium is preferably from about 0 to about 40 atomic percent. First metal segment 32 and second metal segment 34 each have three dielectric sides 38 and one metal side 39, wherein first dielectric layer 47 overlies the three dielectric sides 38 of first metal segment 32, and second dielectric layer 48 overlies the three dielectric sides 38 of second metal segment 34, as illustrated in FIG. 1.

First dielectric layer 47, second dielectric layer 48, and third dielectric layer 49 comprise any material that can prevent a significant amount of charge from leaking from metal carrier 30 (shown in FIG. 2), such as an insulating dielectric. Preferably dielectric layers 47, 48, 49 comprise metal oxide that can be grown by any using any one of a number of processes, such as, for example, thermal oxidation, thermal nitridation, anodization, or any other method known to one of ordinary skill in the art Dielectric layers 47, 48,49 prevent electrical charges from migrating between metal carrier 30 and other components of double capacitor structure 28. Second metal segment 34 is adjacent to first metal segment 32. Metal side 39 of second metal segment 34 faces metal side 39 of first metal segment 32 Second via hole 52 is positioned in between first metal segment 32 and second metal set 34, wherein second via hole 52 is coupled to the first metal segment 32 and the second metal segment 34, as illustrated in FIG. 1. Preferably, second via hole 52 is coupled to metal side 39 of second metal segment 34 and metal side 39 of first metal segment 32.

Third metal segment 36 is positioned adjacent second metal segment 34. Third metal segment 36 has four dielectric sides 38. Third dielectric layer 49 overlies the four dielectric sides 38 of third metal segment 36. First via hole 50 is positioned in between third metal segment 36 and second metal segment 34, wherein first via hole 50 is electrically isolated from third metal segment 36 and second metal segment 34 by second dielectric layer 48 and third dielectric layer 49. Third via hole 54 is positioned adjacent to third metal segment 36 and first metal segment 32, wherein third via hole 54 is electrically isolated from third metal segment 36 by third dielectric layer 49, as illustrated in FIG. 1.

It should be understood that first metal segment 32, second metal segment 34 and third metal segment 36 are all part of the same metal carrier as will be explained in more detail hereafter.

First dielectric layer 47, second dielectric layer 48, and third dielectric layer 49 comprise top surface 22 and bottom surfaces 24, wherein electrodes 70 are formed on at least one of top surface 22 and bottom surface 24 of dielectric layers 47, 48, 49, as illustrated in FIG. 1. Preferably, electrodes 70 are formed on each top surface 22 and each bottom surface 24 of each dielectric layer 47, 48, 49. In one preferred embodiment, electrodes 70 formed on the top surfaces 22 and bottom surfaces 24 of dielectric layers 47, 48, 49 are electrically isolated from first via hole 50 and second via hole 52 by insulators 76 placed around first via hole 50 and second via hole 52 to provide electrical isolation between electrodes 70, first via hole 50, and second via hole 52. Insulators 76 may be any insulating material known to one of ordinary skill in the art, which restricts the flow of electrons, such as a screened dielectric containing a ceramic or glass material or a polymeric insulating material such as polyimide. Alternatively, insulators 76 can be dispensed with entirely so long as a gap remains between electrodes 70, first via hole 50 and second via hole 52.

As will be appreciated by those of skill in this art, the preceding embodiment illustrated in FIG. 1 is provided, not to limit the scope of the present invention, but to illustrate the nature of the present invention and possible uses for the teachings of the present invention. This embodiment may be modified in many different ways while still obtaining the benefits of the teachings of the present invention. For example, the present embodiment with respect to double capacitor structure 28 describes first via hole 50 in between second via hole 52 and third via hole 54, however, the present invention should not be construed as limited in that first via hole 50, second via hole 52, and third via hole 54 may be ordered in many different ways, known to one of ordinary skill in the art, and still create a functioning double capacitor structure 28. Correspondingly, first metal segment 32, second metal segment 34, and third metal segment 36 may also be ordered in many different ways, known to one of ordinary skill in the art, and still create a functioning double capacitor structure 28.

Figure 2:
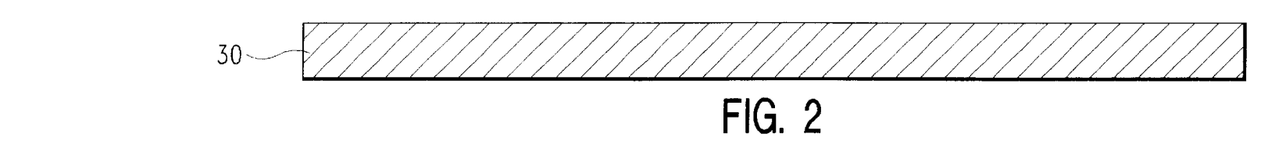
FIGS. 2–4 illustrate, in cross-section, process steps for the fabrication of a structure forming a double capacitor structure, in accordance with the invention.
Figure 3:
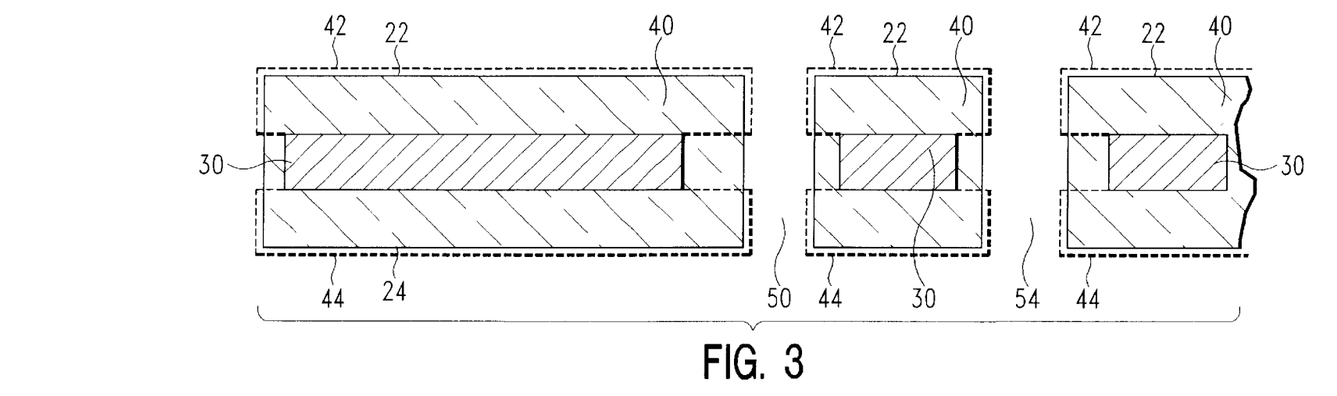
Figure 4:
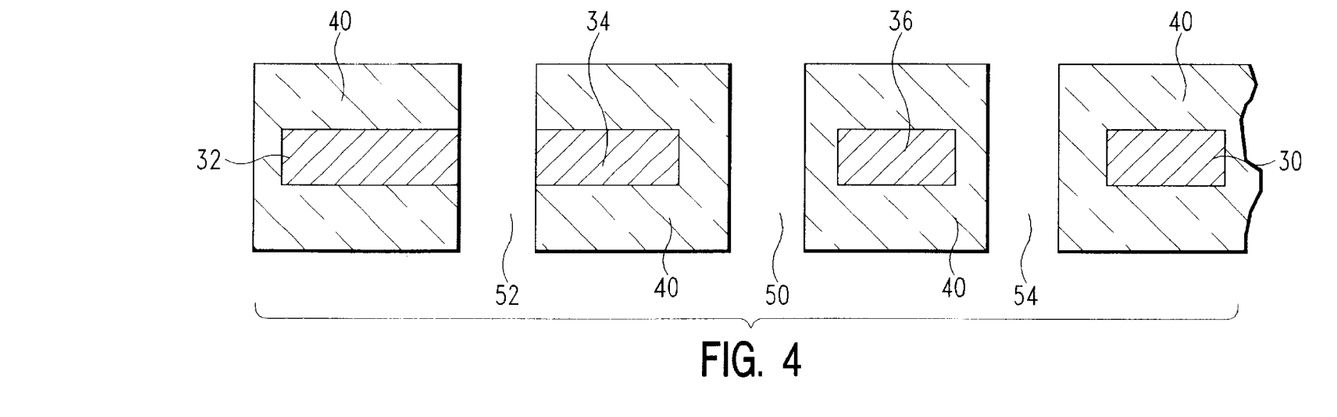

FIGS. 2–4 illustrate a process for fabricating structure 20 having double capacitor structure 28. The process begins with metal carrier 30. Preferably metal carrier 30 comprises material selected from the group consisting of titanium, tantalum, nickel, aluminum, and alloys thereof; however, metal carrier 30 can comprise any conductive material that permits the flow of electrons and forms an insulating dielectric oxide layer. In one preferred embodiment, metal carrier 30 comprises an alloy of titanium and tantalum wherein the percentage of titanium is preferably from about 0 to about 40 atomic percent. Preferably, metal carrier 30 conforms to the shape of a generally flat sheet of material, as illustrated in FIG. 2.

Once metal carrier 30 has been formed, first via hole 50 and third via hole 54 are formed through metal carrier 30, as illustrated in FIG. 3. Preferably, first via hole 50 is formed by patterning metal carrier 30 using lithography and a wet or dry etching process; however first via hole 50 can be formed in any one of a number of ways, such as, for example, using a metal punching process, laser assisted wet etching, laser drilling, or any other process or method for forming holes in a metallic structure, such as metal carrier 30, known to one of ordinary skill in the art.

After first via hole 50 and third via hole 54 are formed, insulating dielectric layer 40 is formed around metal carrier 30, inside first via hole 50, and inside third via hole 54. Dielectric layer 40 is comprised of any insulating material that can prevent a significant amount of electrical charge from migrating between metal carrier 30 and other components of the double capacitor structure 28. Preferably dielectric layer 40 comprises metal oxide that can be grown by any using any one of a number of processes, such as, for example, thermal oxidation, thermal nitration, anodization, or any other method known to one of ordinary skill in the art. Metal oxide that forms when using any one of the above mentioned processes, forms an insulating film around metal carrier 30, and inside first via hole 50 and third via hole 54, as illustrated in FIG. 3. Dielectric layer 40 comprises top dielectric layer 42 opposed to bottom dielectric layer 44, as illustrated in FIG. 3. Top dielectric layer 42 comprises all of dielectric layer 40 that resides above metal carrier 30, and bottom dielectric layer 44 comprises all of dielectric layer 40 that resides below metal carrier 30. The surface of top dielectric layer 42 has top surface 22, while the surface of bottom dielectric layer 44 has bottom surface 24, as illustrated in FIGS. 1 and 3.

Once dielectric layer 40 is formed, second via hole 52 is formed through dielectric layer 40 and metal carrier 30, as illustrated in FIG. 4. Second via hole 52 is used to carry a ground signal from the semiconductor chip (not shown) to the underlying structure (not shown). Second via hole 52 can be formed in any one of the number of ways first via hole 50 and third via hole 54 are formed, as described above.

Upon forming via holes 50, 52, 54, via holes 50, 52, 54 are filled with conductive material 60 as shown in FIG. 1. Preferably conductive material 60 comprises at least one metal from the group consisting of silver, palladium, nickel, copper, gold, or platinum; however, conductive material 60 can comprise any material known to one of ordinary skill in the art, which permits the flow of electrons although refractory metals would not be preferred. Preferably, conductive material 60 used to fill via holes 50, 52, 54 comprises the same material, however, different materials can be used to fill different via holes 50, 52, 54. For example, first via hole 50 may be filled using conductive material 60 which comprises silver, and second via hole 52 may be filled using conductive material 60 which comprises gold.

Via holes 50, 52, 54 may be filled in any one of a number of ways known to one of ordinary skill in the art. In one embodiment, the conductive metallic paste is screened to fill via holes 50, 52, 54 and to form electrodes 70, as illustrated in FIG. 1. Insulators 76 are placed around the entrances and exits of via holes 50 and 52, as illustrated in FIG. 1. Insulators 76 are used to prevent signals that enter electrodes 70 from entering second via hole 52 or first via hole 50. Insulators 76 may comprise any insulating materials known to one of ordinary skill in the art that restrict the flow of electrons, such as a screened dielectric of ceramic or glass or any polymeric insulating material such as polyimide.

Preferably, insulators 76 are formed before electrodes 70 are formed, however insulators 76 can be formed after electrodes 70 are formed. In the first case, insulators 76 would be a screened dielectric containing a ceramic or glass material. This variation has the advantage that during sintering of the double capacitor structure 28, the metallic paste used for via holes 50, 52, 54 and electrodes 70 and screened dielectric insulators 76 would all sinter at the same time. In the second case, the metallic paste used for vias holes 50, 52, 54 and electrodes 70 would simultaneously sinter. Dielectric insulators 76 would then be added after sintering and would preferably comprise the polymeric material.

Sintering of the double capacitor structure 28 would be needed to density the metallic paste and screened dielectric material and would proceed according to conventional practice at a temperature between 500 and 900° C., depending on the choice of metallic and insulating materials.

In another variation, via holes 50, 52, 54 are filled and electrodes 70 are created using an electroplating process. In this embodiment, a seed layer is deposited on all surfaces of structure 20 that are required to bond with a metal. For example, the seed layer is deposited, using a resist stencil, inside via holes 50, 52, 54 and on the surfaces of the dielectric layer 40 upon which electrodes 70 are formed. Once the seed layer is deposited, the surface of the seed layer is electroplated using a patterning plating process with a conductive metal, such as silver, palladium, nickel, copper, gold, platinum, or any other material known to one of ordinary skill in the art which permits the flow of electrons. It is contemplated that the conductive metal in the patterning plating process could comprise solder, since solder may be used to join structure 20 to a semiconductor chip (not shown) or an underlying substrate (not shown). After removal of the resist stencil and the seed layer, electrical isolation between electrodes 70, first via hole 50, and second via hole 52 can be enhanced by filling the formed void with insulators 76 as described previously.

As a further variation of the present invention, via holes 56, 52, 54 could be filled with a conductive paste and then electrodes 70 formed by an electroplating process or a vapor deposition process. The electrodes 70 can be deposited through a mask or stencil or blanket deposited and then subtractively etched.

Figure 5:
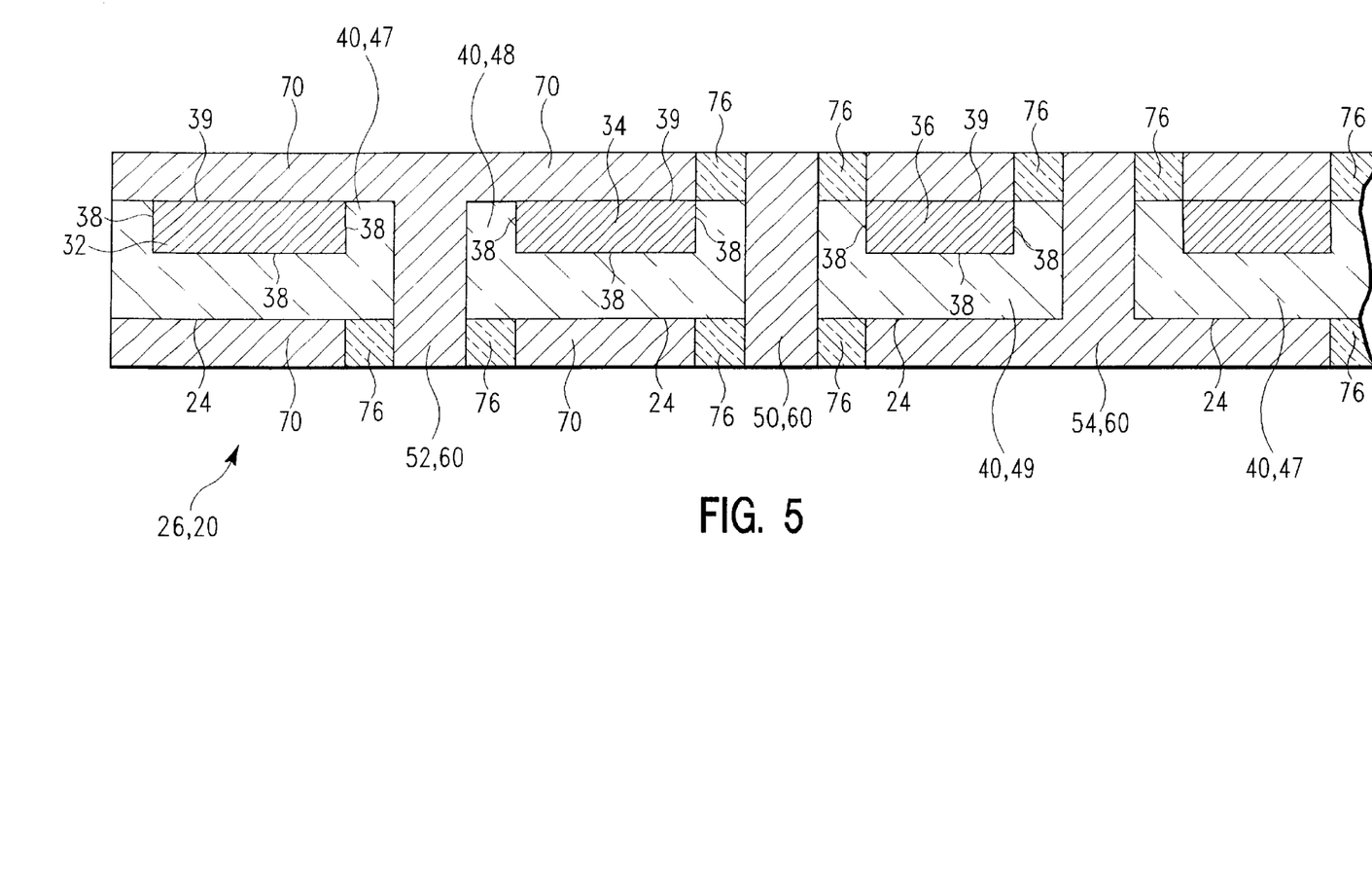
FIG. 5 illustrates, in cross-section, a portion of a structure forming a single capacitor structure, in accordance with the invention.

Referring now to FIG. 5, in cross-section, is structure 20 forming single capacitor structure 26. Note that while FIG. 5 illustrates only one complete single capacitor structure 26, a structure 20 may have thousands or even millions of single capacitor structures identical to single capacitor structure 26. For the sake of clarity, these additional single capacitor structures have been left out of FIG. 5.

FIG. 5 illustrates the physical structure for single capacitor structure 26, which can be formed by processes and methods to be described hereafter. Single capacitor structure 26 comprises first metal segment 32, second metal segment 34, and third metal segment 36. In one preferred embodiment, first metal segment 32, second metal segment 34, and third metal segment 36 are comprised of a material selected from the group consisting of titanium, tantalum, nickel, aluminum and alloys thereof. However, first metal segment 32, second metal segment 34, and third metal segment 36 may comprise any conducting material that permits the flow of electrons so long as an insulating dielectric layer is formed. In one preferred embodiment, first metal segment 32, second metal segment 34, and third metal segment 36 comprise an alloy of titanium and tantalum wherein the percentage of titanium is preferably from about 0 to about 40 atomic percent. First metal segment 32, second metal segment 34, and third metal segment 36 each have three dielectric sides 38 and one metal side 39, wherein first dielectric layer 47 overlies the three dielectric sides 38 of first metal segment 32, second dielectric layer 48 overlies the three dielectric sides 38 of second metal segment 34, and third dielectric layer 49 overlies the three dielectric sides 38 of third metal segment 36.

First dielectric layer 47, second dielectric layer 48, and third dielectric layer 49 comprise any material that can prevent a significant amount of charge from leaking from metal carrier 30, such as an insulating dielectric. Preferably, dielectric layers 47, 48, 49 comprise metal oxide that can be grown by using any one of a number of processes, such as, for example, thermal oxidation, thermal nitridation, anodization, or any other method known to one of ordinary skill in the art. Second metal segment 34 is adjacent to first metal segment 32. In one preferred embodiment, electrodes 70 overlie at least one metal side 39 of first metal segment 32 and second metal segment 34. Second via hole 52 is positioned in between first metal segment 32 and second metal segment 34, wherein second via hole 52 is electrically connected to first metal segment 32 and second metal segment 36 by electrodes 70, as illustrated in FIG. 5. In one preferred embodiment, electrodes 70 are mounted to at least one bottom surface 24 of first dielectric layer 47 and second dielectric layer 48, as illustrated in FIG. 5.

Third metal segment 36 is positioned adjacent second metal segment 34. In one preferred embodiment, electrode 70 overlies metal side 39 of third metal segment 36. First via hole 50 is positioned in between second metal segment 34 and third metal segment 36, wherein first via hole 50 is electrically isolated from second metal segment 34 and third metal segment 36 by second dielectric layer 48 and third dielectric layer 49. In one preferred embodiment, electrode 70 is mounted to bottom surface 24 of third dielectric layer 49, as illustrated in FIG. 5. should be understood that first metal segment 32, second metal segment 34 and third metal segment 36 are all parts of the same metal carrier as will be explained in more detail hereafter.

In one preferred embodiment, third via hole 54 is positioned adjacent third dielectric layer 49, wherein third via hole 54 is electrically isolated from third metal segment 36 by third dielectric layer 49 and insulator 76, as illustrated in FIG. 5. In one preferred embodiment, electrodes 70 are electrically isolated from first via hole 50.

In one preferred embodiment, insulator 76 are placed around the entrances of via holes 50 and 54, and at the exits of via holes 50 and 52, as illustrated in FIG. 5. Insulators 76 are used to prevent the electrical signals which enter electrodes 70 to enter first via hole 50, and to isolate the electrical signals in second via hole 52 from the electrical signals in third via hole 54. insulators 76 may comprise any insulating material known to one of ordinary skill in the art, which restricts the flow of electrons, such as a screened dielectric of ceramic or glass material or any polymeric insulating material such as polyimide. Preferably, insulators 76 are formed before electrodes 70 are formed, however insulators 76 can be formed after electrodes 70 are formed.

As will be appreciated by those of skill in this art, the preceding embodiment in FIG. 5 is provided, not to limit the scope of the present invention, but to illustrate the nature of the present invention and possible uses for the teachings of the present invention. This embodiment may be modified in many different ways while still obtaining the benefits of the teachings of the present invention. For example, the present embodiment with respect to single capacitor structure 26 describes first via hole 50 in between second via hole 52 and third via hole 54, however, the present invention should not be construed as limited in that first via hole 50, second via hole 52, and third via hole 54 may be ordered in many different ways, known to one of ordinary skill in the art, and still create a functioning single capacitor structure 26. Correspondingly, first metal segment 32, second metal segment 34, and third metal segment 36 may also be ordered in many different ways, known to one of ordinary skill in the art, and still create a functioning single capacitor structure 26

Figure 6:
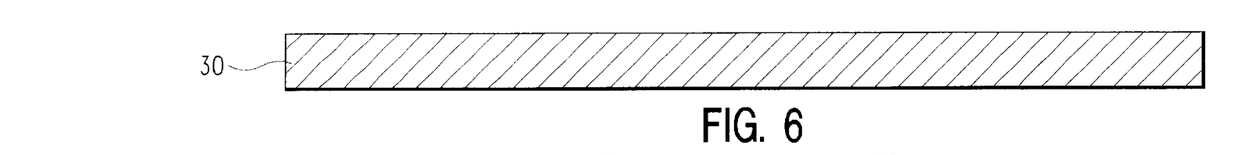
FIG. 6–8 illustrate, in cross-section, process steps for the fabrication of a structure forming a single capacitor structure, in accordance with the invention.
Figure 7:
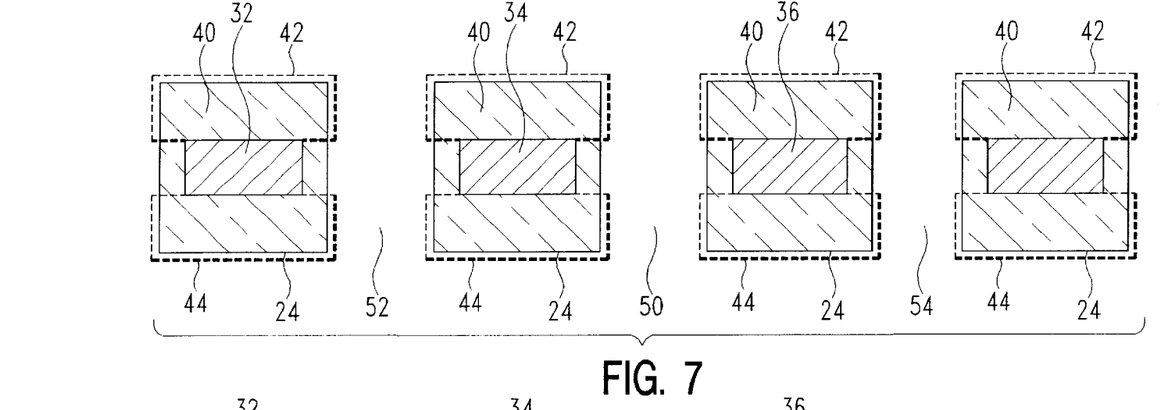
Figure 8:
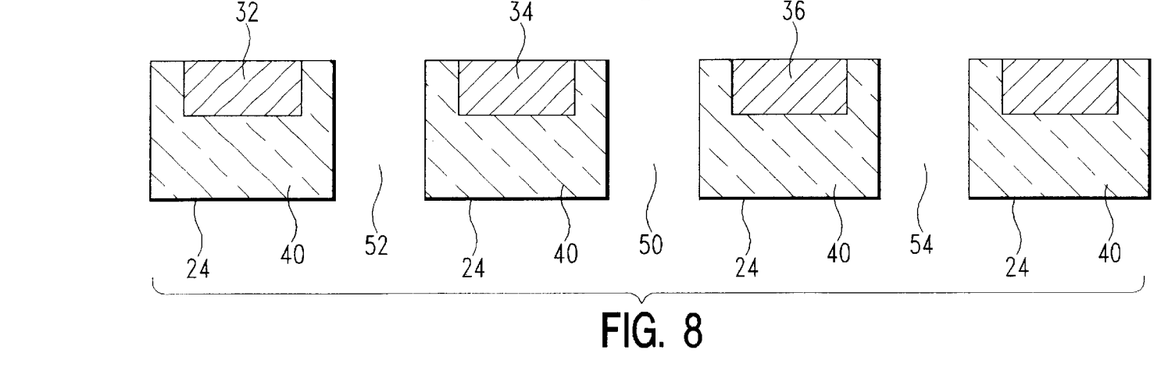

FIGS. 6–8 illustrate a process for fabricating structure 20 having single capacitor structure 26. The process begins with metal carrier 30. Preferably metal carrier 30 comprises material selected from the group consisting of titanium, tantalum, nickel, aluminum, and alloys thereof; however, metal carrier 30 can comprise any conductive material that permits the flow of electrons so long as it forms an insulating dielectric oxide. In one preferred embodiment, metal carrier 30 comprises an alloy of titanium and tantalum wherein the percentage of titanium preferably is from about 0 to about 40 atomic percent. Preferably, metal carrier 30 conforms to the shape of a generally flat sheet of material, as illustrated in FIG. 6.

Once metal carrier 30 has been formed, via holes 50, 52, 54 are formed prior to forming dielectric layer 40, as illustrated in FIG. 7. Once via holes 50, 52, 54 are formed, dielectric layer 40 is formed. The formation of via holes 50, 52, 54 and dielectric layer 40 can be accomplished in the same manner as was done with respect to the embodiment of FIGS. 1–4. Single capacitor structure 26 should not have top dielectric layer 42. Accordingly, either top dielectric layer 42 should not be formed when dielectric layer 40 is formed (e.g., metal carrier may be masked to prevent the formation of dielectric layer 40 with the resulting structure shown in FIG. 8) or formed and removed as shown in FIGS. 7 and 8. Top dielectric layer 42 can be removed from structure 20 in any one of a number of ways known to one of ordinary skill in the art. In one preferred embodiment, top dielectric layer 42 is removed from structure 20 using a plasma etch process, however top dielectric layer 42 can be removed using other comparable processes or methods known to those skilled in the art. As used herein, a plasma etch process is a dry-etch process using reactive gases and plasma energy to cause a chemical reaction. Other methods of removing top dielectric layer 40 from metal carrier 30 may also be used, such as a wet-etch process which requires stripping top dielectric layer 42 with chemicals, or using an ion beam without a mask, or a wet-etch/dry-etch process with a resist stencil to protect bottom dielectric layer 44. Use of the plasma etch process is preferred because the plasma etch process will selectively remove top dielectric layer 42 without substantially affecting the underlying metal carrier 30. Upon forming dielectric layer 40, via holes 50, 52, 54 are filled with conductive material 60. Via holes 50, 52, 54 may be filled in any one of a number of ways known to one of ordinary skill in the art, as described above. Electrodes 70 are then formed overlying at least one of metal carrier 30 and bottom surfaces 24, as described above.

In one preferred embodiment, insulators 76 are placed around the entrances of via holes 50 and 54, and at the exits of via holes 50 and 52, as illustrated in FIG. 5. Insulators 76 are used to prevent the electrical signals which enter electrodes 70 to enter first via hole 50, and to isolate the electrical signals in second via hole 52 from the electrical signals in third via hole 54. Insulators 76 may comprise any insulating material known to one of ordinary skill in the art, which restricts the flow of electrons, such as a screened dielectric or any polymeric insulating material.

As discussed previously with respect to the FIGS. 1–4 embodiment of the present invention, the filling of via holes 50, 52, 54 and the formation of electrodes 70 and insulators 76 may be accomplished in a number of ways. One variation would be to simultaneously screen metallic paste 60 for via holes 50, 52, 54 and electrodes 70. Insulators 76, if formed of a ceramic or glass paste, may then be screened, followed by sintering of the entire single capacitor structure 26 at a temperature between about 500 and 900° C. depending on the materials used. If insulators 76 were of a polymeric material, they would be added post-sintering.

As another variation, metallic paste 60 could be deposited to fill via holes 50, 52, 54 followed by sintering. Electrodes 70 could then be deposited by electroplating or vapor deposition.

As a last variation, via holes 50, 52, 54 could be filled and electrodes 70 formed at the same time by electroplating or vapor deposition. In this last variation, sintering of the single capacitor structure 26 would not be necessary.

Double capacitor structure 28 and single capacitor structure 26 that are formed by the present invention are preferably for use as an interposer decoupling capacitor that can be placed between a semiconductor chip and an underlying substrate. The interposer decoupling capacitor has the ability to transmit electrical signals, ground and power between the semiconductor chip (not shown) and the underlying substrate (not shown) using via holes 50, 52, 54 that comprise a metallic substance and are insulated from each other. Each via hole 50, 52, 54 can be electrically connected to the semiconductor chip on the one side of structure 20 and the underlying substrate on the other side of structure 20. Preferably, these electrical connections should be made using solder or other equivalent methods of direct connections.

In order to increase capacitance, additional structures 20, which comprise either double capacitor structure 28 or single capacitor structure 26, can be stacked above or below structure 20 and connected to structure package 20 by mounting connectors, such as controlled collapse chip connections (called C4s) or wire bonds, to electrodes 70.

It is to be understood that a wide range of changes and modifications to the embodiments described above will be apparent to those skilled in the art and are contemplated. It is therefore intended that the foregoing detailed description be regarded as illustrative, rather than limiting, and that it be understood that it is the following claims, including all equivalents, that are intended to define the spirit and scope of the invention.

What is claimed is:

1. A process for fabricating a structure using a metal carrier comprising:
   forming a first via hole through the metal carrier;
   oxidizing the metal carrier to form a dielectric layer around the metal carrier and inside the first via hole;
   forming a second via hole through the dielectric layer and the metal carrier and
   filling the first and second via holes with conductive material for electrical continuity wherein the conductive material contacts the metal carrier in the second via hole and the dielectric layer insulates the metal carrier from the conductive material in the first via hole.

2. A process for making a capacitor comprising:
   fabricating a structure by the process of claim 1; and
   forming the capacitor comprising the structure.

3. The process of claim 1, wherein the metal carrier comprises a material selected from the group consisting of titanium, tantalum, nickel, aluminum and alloys thereof.

4. The process of claim 3 wherein the metal carrier comprises an alloy of titanium and tantalum.

5. The process of claim 1 further comprising:
   forming a third via hole through the metal carrier before the oxidizing of the metal carrier, and wherein the dielectric layer is formed around the metal carrier and inside the third via hole;
   filling the third via hole with conductive material for electrical continuity wherein the dielectric layer insulates the metal carrier from the conductive material in the third via hole.

6. The process of claim 1, wherein the conductive material comprises a conductive metallic plate.

7. The process of claim 6 further comprising:
   screening the conductive metallic paste to fill the via holes;
   using the conductive metallic paste to form electrodes, wherein the dieletric layer comprises a top surface opposed to a bottom surface, and the electrodes are formed on the top surface and the bottom surface of the dielectric layer and wherein the electrodes are insulated from contact with the conductive material of the first and second vias.

8. The process of claim 7 further comprising sintering the structure after the forming of the electrodes.

9. The process of claim 1 further comprising:
   depositing a seed layer overlying the dielectric layer;
   patterning the seed layer;
   plating metal on the seed layer.

10. The process of claim 6 further comprising:
    screening the conductive metallic paste to fill the via holes;
    electroplating electrodes, wherein the dielectric layer comprises a top surface opposed to a bottom surface, and the electrodes are formed on the top surface and the bottom surface of the dielectric layer and wherein the electrodes are insulated from contact with the conductive material of the first and second vias.

11. The process of claim 10 wherein the patterning of the seed layer forms gaps between select vias and the electrodes and wherein the gaps are filled with an insulator.

12. The process of claim 1 further comprising:
    electroplating the conductive material;
    electroplating electrodes, wherein the dielectric layer comprises a top surface opposed to a bottom surface, and the electrodes are formed on at least one of the top surface and the bottom surface of the dielectric layer.

13. A process for fabricating a structure using a metal carrier comprising:
    forming a first via hole through the metal carrier;
    forming a second via hole and a third via hole through the metal carrier;
    oxidizing the metal carrier to form a dielectric layer around the metal carrier and the inside the first, second and third via holes, wherein the dielectric layer comprises a top dielectric layer opposed to a bottom dielectric layer;
    removing the top dielectric layer; and
    filling the first, second and third via holes with conductive material for electrical continuity wherein the dielectric layer insulates the metal carrier from the conductive material in the said first, second and third via holes.

14. The process of claim 13, wherein the conductive material is formed overlying a portion of the dielectric layer.

15. The process of claim 13, wherein the conductive material comprises a conductive metallic paste.

16. The process of claim 15 further comprising:
    screening the conductive metallic paste to fill the via holes;
    using the conductive metallic paste to form electrodes and the electrodes are formed directly on the metal carrier and the bottom dielectric layer.

17. The process of claim 13 further comprising:
    depositing a seed layer overlying the dielectric layer;
    patterning the seed layer; and
    plating metal on the seed layer.

18. The process of claim 15 further comprising:

screening the conductive metallic paste to fill the via holes;

electroplating electrodes and the electrodes are formed directly on the metal carrier and bottom dielectric layer.

19. The process of claim 13 further comprising:

electroplating the conductive material;

electroplating electrodes, wherein the dielectric layer comprises a top surface opposed to a bottom surface, and the electrodes are formed on at least one of the top surface and the bottom surface of the dielectric layer.

20. A process for fabricating a structure having a metal carrier, the metal carrier forming a first via hole, the process comprising:

oxidizing the metal carrier to form a dielectric layer around the metal carrier and inside the first via hole;

forming a second via hole through the dielectric layer and the metal carrier; and filing the via holes with conductive material.

* * * * *